(12) United States Patent
Tanihira et al.

(10) Patent No.: US 11,508,854 B2
(45) Date of Patent: Nov. 22, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kei Tanihira, Himeji Hyogo (JP); Yoichi Hori, Himeji Hyogo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/177,708

(22) Filed: Feb. 17, 2021

(65) Prior Publication Data

US 2021/0376168 A1 Dec. 2, 2021

(30) Foreign Application Priority Data

May 29, 2020 (JP) .............................. JP2020-094936

(51) Int. Cl.
*H01L 29/872* (2006.01)
*H01L 29/06* (2006.01)
*H01L 29/16* (2006.01)

(52) U.S. Cl.
CPC ........ *H01L 29/872* (2013.01); *H01L 29/0634* (2013.01); *H01L 29/1608* (2013.01)

(58) Field of Classification Search
CPC ............... H01L 29/872; H01L 29/0634; H01L 29/1608; H01L 29/0626; H01L 29/417;
(Continued)

(56) References Cited

U.S. PATENT DOCUMENTS 9,142,687 B2 9/2015 Hori et al.
2009/0302327 A1 12/2009 Rexer et al.
(Continued)

FOREIGN PATENT DOCUMENTS

JP 2012-204411 A 10/2012
JP 2013-140901 A 7/2013
(Continued)

*Primary Examiner* — Jack S Chen
(74) *Attorney, Agent, or Firm* — Allen & Overy LLP

(57) ABSTRACT

A semiconductor device includes a first electrode, a first semiconductor region connected to the first electrode and being of a first conductivity type, a second semiconductor region provided on the first semiconductor region, contacting the first semiconductor region and being of a second conductivity type, first metal layers and second metal layers provided on the second semiconductor region and contacting the second semiconductor region, a third semiconductor region provided between the first semiconductor region and the first metal layer, and a second electrode. The third semiconductor region contacts the first and second semiconductor regions and being of the first conductivity type. An impurity concentration of the third semiconductor region is greater than an impurity concentration of the first semiconductor region. The second electrode contacts the first semiconductor region, the second semiconductor region, the first metal layers, and the second metal layers.

8 Claims, 7 Drawing Sheets

(58) Field of Classification Search
CPC ............. H01L 29/0615; H01L 29/0619; H01L 29/0692
See application file for complete search history.

(56) References Cited

U.S. PATENT DOCUMENTS

| | | |
|---|---|---|
| 2012/0241762 A1 | 9/2012 | Noda et al. |
| 2013/0140584 A1 | 6/2013 | Kameshiro et al. |
| 2019/0088648 A1* | 3/2019 | Hori .................... H01L 21/8213 |

FOREIGN PATENT DOCUMENTS

| | | |
|---|---|---|
| JP | 5452718 B2 | 3/2014 |
| JP | 2015-029046 A | 2/2015 |
| JP | 5755722 B2 | 7/2015 |

* cited by examiner

SEMICONDUCTOR DEVICE

CROSS-REFERENCE TO RELATED APPLICATIONS

This application is based upon and claims the benefit of priority from Japanese Patent Application No. 2020-094936, filed on May 29, 2020; the entire contents of which are incorporated herein by reference.

FIELD

Embodiments relate to a semiconductor device.

BACKGROUND

A Schottky barrier diode (SBD) is known in which a metal and a semiconductor have a junction. The SBD is advantageous in that the voltage drop in the forward direction is low, and the switching speed is high. On the other hand, in a SBD having a general structure, a depletion layer spreads toward the semiconductor side; and the electric field due to the charge (e.g., electrons) is highest at the interface between the metal and the semiconductor. Therefore, a JBS (Junction Barrier Schottky) diode has been developed in which a SBD and a p-n junction diode coexist. Because the JBS diode includes a p-n diode, a depletion layer spreads from the semiconductor surface between the n-layer and a p-layer buried in a portion of the n-layer. When a reverse bias voltage becomes high, punch-through occurs between the depletion layers of the p-layers, and the maximum electric field moves directly under the p-layers. The electric field at the surface where many defects and the like exist is reduced thereby, and the leakage current can be suppressed. Also, in a structure in which a $p^+$-layer is buried in a portion of the $n^-$-layer included in the SBD, the p-n junction diode of the $p^+$-layer and the $n^-$-layer of the original SBD is included, and this diode is switched on when a high current (a high surge current) is necessary. The current transport capacity is increased thereby; the increase of the forward voltage when a large current flows is suppressed; and a high surge withstand capacity is realized.

DETAILED DESCRIPTION

A semiconductor device according to an embodiment includes a first electrode, a first semiconductor region, a second semiconductor region, a plurality of first metal layers and a plurality of second metal layers, a third semiconductor region, and a second electrode. The first semiconductor region is connected to the first electrode. The first semiconductor region is of a first conductivity type. The second semiconductor region is provided on the first semiconductor region. The second semiconductor region contacts the first semiconductor region and is of a second conductivity type. The plurality of first metal layers and the plurality of second metal layers are provided on the second semiconductor regions. The plurality of first metal layers and the plurality of second metal layers contact the second semiconductor region, The third semiconductor region is provided between the first semiconductor region and the first metal layer. The third semiconductor region contacts the first and second semiconductor regions and is of the first conductivity type. An impurity concentration of the third semiconductor region is greater than an impurity concentration of the first semiconductor region. The second electrode contacts the first semiconductor region, the second semiconductor region, the first metal layers, and the second metal layers.

First embodiment

First, a first embodiment will be described.

Figure 1:
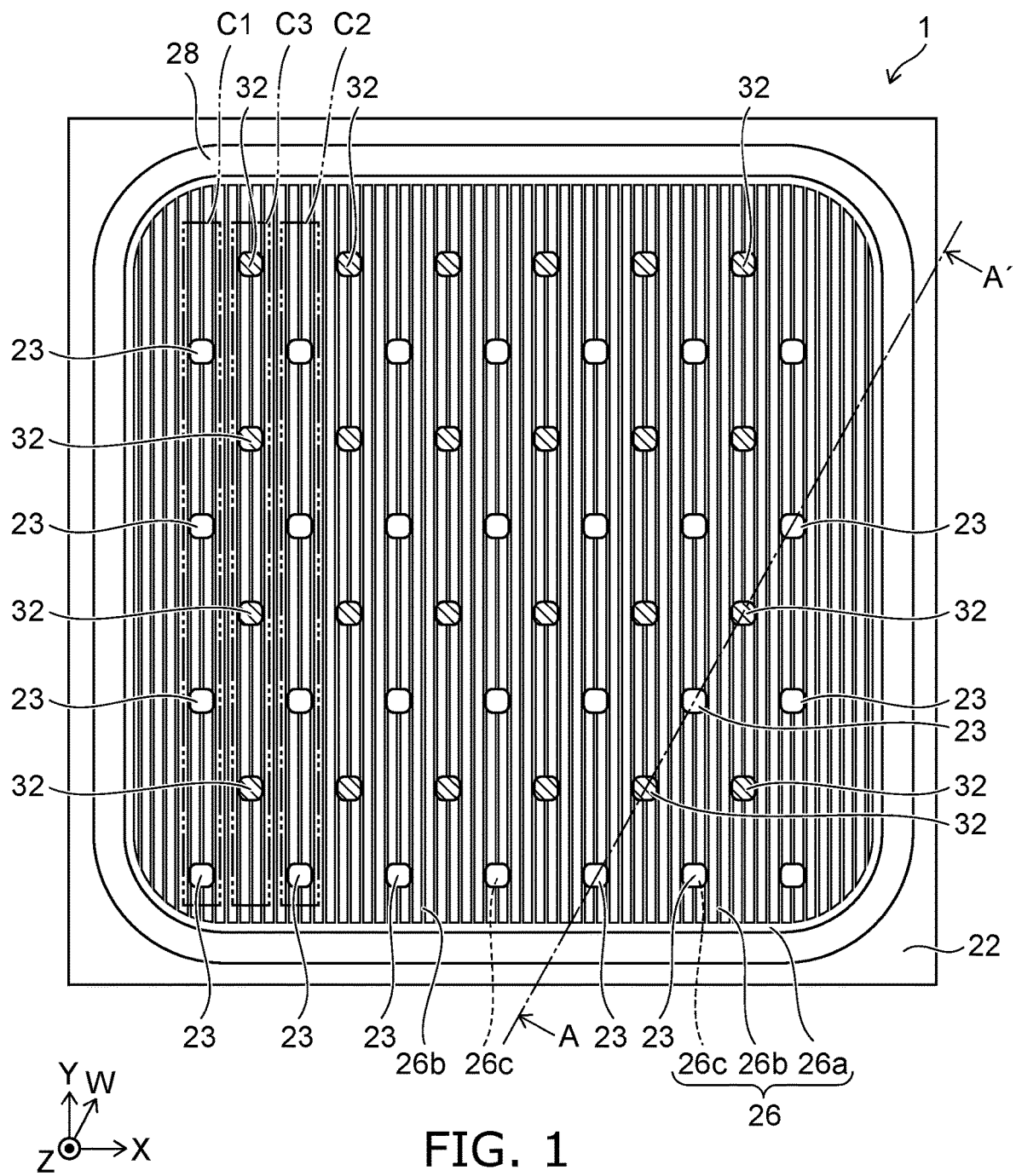
FIG. 1. is a plan view showing a semiconductor device according to a first embodiment.

FIG. 1 is a plan view showing a semiconductor device according to the embodiment.

Figure 2:
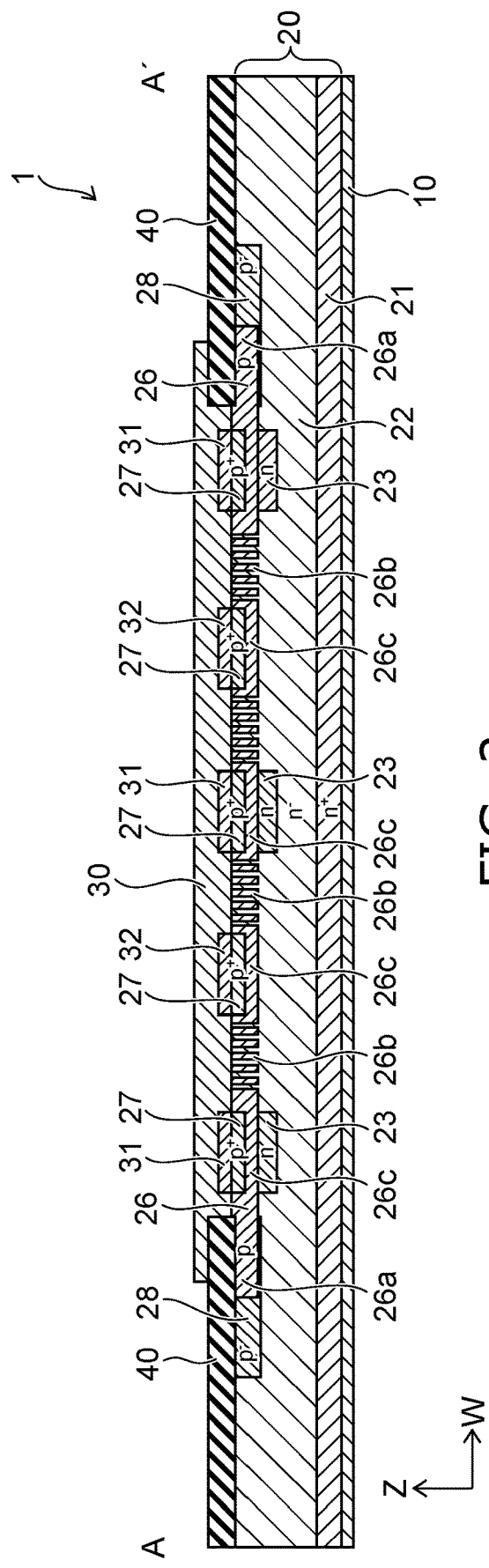
FIG. 2 is a cross-sectional view along line A-A' shown in FIG. 1.

FIG. 2 is a cross-sectional view along line A-A' shown in FIG. 1.

The drawings are schematic; and the components are enhanced, simplified, or omitted as appropriate. The numbers and dimensional ratios of the components do not always match between the drawings. This is similar for the other drawings described below as well.

As shown in FIGS. 1 and 2, a cathode electrode 10 is provided in the semiconductor device 1 according to the embodiment. For example, the cathode electrode 10 is made of a metal such as nickel (Ni), etc., and is located at the entire lower surface of the semiconductor device 1.

A semiconductor part 20 is provided on the cathode electrode 10, The semiconductor part 20 is made of a semiconductor material, e.g., silicon carbide (SiC), e.g., single-crystal SiC. As described below, several semiconductor regions are formed by implanting an impurity that forms donors, e.g., nitrogen (N) or the like, and an impurity that forms acceptors, e.g., aluminum (Al), boron (B), or the like into portions of the semiconductor part 20.

An anode electrode 30, multiple metal layers 31, multiple metal layers 32, and an insulating film 40 are provided on the semiconductor part 20.

An XYZ orthogonal coordinate system is employed for convenience of description in the specification hereinbelow. The direction from the cathode electrode 10 toward the anode electrode 30 is taken as a "Z-direction", and two mutually-orthogonal directions orthogonal to the Z-direction are taken as an "X-direction" and a "Y-direction", Although a direction that is in the Z-direction from the cathode electrode 10 toward the anode electrode 30 also is called "up", and the reverse direction also is called "down", these expressions are for convenience and are independent of the direction of gravity. In the following description, a "W-direction" that is orthogonal to the Z-direction and crosses the X-direction and the Y-direction also is used.

As shown in FIG. 2, the semiconductor part 20 includes an $n^+$-type semiconductor region 21, an $n^-$-type semiconductor region 22, multiple n-type semiconductor regions 23, a p-type semiconductor region 26, multiple $p^+$-type semiconductor regions 27, and a p⁻-type semiconductor region 28. The planar arrangement of the semiconductor regions is described below.

The n⁺-type semiconductor region 21 is, for example, an n-type SiC substrate. The n⁻-type semiconductor region 21 contacts the cathode electrode 10. The n⁻-type semiconductor region 22 is located on the n⁺-type semiconductor region 21.

The conductivity type of the n⁻-type semiconductor region 22 is the n-type. The impurity concentration of the n⁻-type semiconductor region 22 is less than the impurity concentration of the n⁺-type semiconductor region 21, e.g., about $2\times10^{16}$ (cm⁻³). The n⁻-type semiconductor region 22 is electrically connected to the cathode electrode 10 via the n⁺-type semiconductor region 21. The multiple n-type semiconductor regions 23 are provided on a portion of the n⁻-type semiconductor region 22. The conductivity type of the n-type semiconductor regions 23 is the n-type, and the impurity concentration of the n-type semiconductor regions 23 is greater than the impurity concentration of the n⁻-type semiconductor region 22. The impurity concentration of the n-type semiconductor regions 23 is, for example, about $3\times10^{17}$ (cm⁻³).

The p-type semiconductor region 26 is provided on the n⁻-type semiconductor region 22 and on the n-type semiconductor regions 23 and contacts the n⁻-type semiconductor region 22 and the n-type semiconductor regions 23. The p⁺-type semiconductor regions 27 are provided on the p-type semiconductor region 26 and contact the p-type semiconductor region 26. The impurity concentration of the p⁻-type semiconductor regions 27 is greater than the impurity concentration of the p-type semiconductor region 26. Some of the p⁺-type semiconductor regions 27 are provided in regions directly above the n-type semiconductor regions 23; and the other p⁺-type semiconductor regions 27 are provided at positions separated from the regions directly above the n-type semiconductor regions 23. In other words, the n-type semiconductor regions 23 are provided between the n⁻-type semiconductor region 22 and some of the p⁺-type semiconductor regions 27 in the Z-direction; and the n-type semiconductor regions 23 are not provided between the n⁻-type semiconductor region 22 and the other p⁺-type semiconductor regions 27 in the Z-direction. The p⁻-type semiconductor region 28 is provided at the periphery of the p-type semiconductor region 26 and contacts the p-type semiconductor region 26. The impurity concentration of the p⁻-type semiconductor region 28 is less than the impurity concentration of the p-type semiconductor region 26. The p⁻-type semiconductor region 28 is separated from the p⁺-type semiconductor regions 27.

The metal layers 31 are provided on the p⁺-type semiconductor regions 27 in the regions directly above the n-type semiconductor regions 23 and contact the p⁺-type semiconductor regions 27, The metal layers 32 are provided on the p⁺-type semiconductor regions 27 in a portion of the region other than the regions directly above the n-type semiconductor regions 23 and contact the p⁺-type semiconductor regions 27. In other words, the p⁺-type semiconductor regions 27 are provided between the metal layers 31 and the n-type semiconductor regions 23 in the Z-direction, and the p⁺-type semiconductor regions 27 are not provided between the metal layers 32 and the n-type semiconductor regions 23 in the Z-direction. For example, the metal layers 31 and 32 are made of nickel (Ni).

The insulating film 40 is provided on the semiconductor part 20 at the terminal part of the semiconductor device 1, For example, the insulating film 40 is made of silicon oxide (SiO₂). The insulating film 40 contacts the n⁻-type semiconductor region 22, the p-type semiconductor region 26, the p⁻-type semiconductor region 28, and the anode electrode 30.

The anode electrode 30 is provided on the semiconductor part 20 in a part (hereinbelow, called the "cell part") other than the terminal part of the semiconductor device 1. The terminal part of the semiconductor device 1 surrounds the cell part. The peripheral portion of the anode electrode 30 extends onto the inner portion of the insulating film 40. For example, the anode electrode 30 is made of titanium (Ti). The anode electrode 30 contacts the n⁻-type semiconductor region 22, the p-type semiconductor region 26, the metal layers 31, the metal layers 32, and the insulating film 40. The p⁻-type layer 28 described above is provided in the terminal part and surrounds a portion of the semiconductor regions provided in the cell part.

The planar arrangement of the semiconductor regions will now be described.

FIG. 1 shows the semiconductor part 20 and the metal layers 32; the metal layers 31, the anode electrode 30, and the insulating film 40 are not illustrated. Only the metal layers 32 are marked with hatching for easier viewing of the drawing.

As shown in FIGS. 1 and 2, the n⁺-type semiconductor region 21 and the n⁻-type semiconductor region 22 are located in the entire semiconductor device 1 when viewed from the Z-direction. As described above, the anode electrode 30 is located in the cell part of the semiconductor device 1; the insulating film 40 is located in the terminal part of the semiconductor device 1; and portions of the anode electrode 30 and the insulating film 40 overlap each other when viewed from the Z-direction.

The metal layers 31 and the metal layers 32 are located in the cell part of the semiconductor device 1. The shape of each of the metal layers 31 and 32 is, for example, square or circular with rounded corners when viewed from the Z-direction, However, the shape of each of the metal layers 31 and 32 is not limited thereto. The surface area of each metal layer 31 is equal to the surface area of each metal layer 32 when viewed from the Z-direction. The metal layers 31 and 32 are periodically arranged on the XY plane and are arranged in, for example, a hexagonal close-packed configuration.

Specifically, a first column includes the multiple metal layers 31 arranged periodically along the X-direction; multiple first columns are provided; a second column includes the multiple metal layers 32 arranged periodically along the X-direction; and multiple second columns are provided. The first columns that include the metal layers 31 and the second columns that include the metal layers 32 are alternately and periodically arranged along the Y-direction.

Also, multiple columns are periodically arranged along the Y-direction, and each column includes the multiple metal layers 31; and multiple columns are arranged periodically along the Y-direction, and each column includes the multiple metal layers 32. The columns that extend in the Y-direction and include the metal layers 31 and the columns that extend in the Y-direction and include the metal layers 32 are alternately and periodically arranged along the X-direction.

The metal layers 31 and the metal layers 32 also are alternately arranged along the W-direction. For example, the W-direction is tilted 60° with respect to the X-direction and 30° with respect to the Y-direction. Thereby, a triangle that connects the centers of the three most proximate metal layers of the multiple metal layers 31 and 32 is an equilateral triangle when viewed from the Z-direction.

In other words, in the first and second columns C1 and C2 that extend in the Y-direction, only the metal layers 31 are periodically arranged, and the metal layers 32 are not provided.

In a third column C3 that extends in the Y-direction and is positioned between the first column C1 and the second column C2 in the X-direction, only the metal layers 32 are periodically arranged, and the metal layers 31 are not provided. The metal layers 32 are not provided between the metal layers 31 of the first column C1 and the metal layers 31 of the second column C2 next to each other in the X-direction.

The $p^+$-type semiconductor regions 27 are located in the regions directly under the metal layers 31 and 32 and contact the metal layer 31 or 32. The $p^+$-type semiconductor regions 27 have ohmic connections with the metal layers 31 and 32. The shape and size of the $p^+$-type semiconductor region 27 is substantially the same as the shape and size of the metal layer 31 or 32.

The p-type semiconductor region 26 is located substantially in the cell part of the semiconductor device 1. The p-type semiconductor region 26 includes a frame-shaped part 26a, multiple line-shaped parts 26b, and multiple circular parts 26c. When viewed from the Z-direction, the frame-shaped part 26a is frame-shaped and is, for example, rectangular or square with rounded corners. The frame-shaped part 26a is located along the outer edge of the cell part.

The multiple line-shaped parts 26b are located inside the frame-shaped part 26a. Each line-shaped part 26b has a straight-line shape extending in the Y-direction; and the two end portions of each line-shaped part 26b are linked to the frame-shaped part 26a. The multiple line-shaped parts 26b are periodically arranged along the X-direction.

The multiple circular parts 26c are located inside the frame-shaped part 26a. The circular parts 26c are linked with the multiple line-shaped parts 26b. The circular parts 26c are located in the regions directly under the pt-type semiconductor regions 27, and therefore are located in the regions directly under the metal layers 31 and 32. The circular parts 26c contact the $p^+$-type semiconductor regions 27. The shape and size of the circular part 26c are substantially equal to the shape and size of the $p^+$-type semiconductor region 27 when viewed from the Z-direction.

The n-type semiconductor regions 23 are provided only in the regions directly under the circular parts 26c of the p-type semiconductor region 26 and directly under the metal layers 31.

The n-type semiconductor regions 23 are not provided in the regions directly under the metal layers 32. Therefore, the multiple n-type semiconductor regions 23 are periodically arranged along the X-direction and the Y-direction. In other words, the multiple n-type semiconductor regions 23 are arranged in a matrix configuration. However, the distance between the n-type semiconductor regions 23 next to each other in the X-direction is less than the distance between the n-type semiconductor regions 23 next to each other in the Y-direction. The n-type semiconductor regions 23 contact the circular parts 26c.

The $p^-$-type semiconductor region 28 is located at the outer side of the frame-shaped part 26a of the p-type semiconductor region 26. The upper surface of the $p^-$-type semiconductor region 28 contacts the insulating film 40. However, the $p^-$-type semiconductor region 28 does not reach the terminal edge of the semiconductor device 1.

Operations and effects of the semiconductor device 1 according to the embodiment will now be described.

In the semiconductor device 1, a Schottky barrier diode (SBD) is formed of the $n^-$-type semiconductor region 22 and the anode electrode 30. The Schottky barrier diode has a high switching speed and a low voltage drop in the forward direction.

Because the line-shaped parts 26b of the p-type semiconductor region 26 are connected to the anode electrode 30, depleted semiconductor regions are formed with the interfaces between the $n^-$-type semiconductor region 22 and the line-shaped parts 26b as starting points when a reverse voltage is applied. Therefore, compared to the case where the line-shaped parts 26b are not provided, the position at which the electric field concentrates can be displaced to be lower than the interface between the $n^-$-type semiconductor region 22 and the anode electrode 30. As a result, the leakage current can be suppressed.

The anode electrode 30 has ohmic connections with the p-type semiconductor region 26 via the metal layers 31 and 32 and the $p^+$-type semiconductor regions 27. Thereby, p-n diodes are formed at the junction portion between the p-type semiconductor region 26 and the $n^-$-type semiconductor region 22 and the junction portions between the p-type semiconductor region 26 and the n-type semiconductor regions 23. Due to the p-n diodes, a large current can flow in the forward direction; and the current surge withstand capacity is improved, Because the impurity concentration of the n-type semiconductor regions 23 is greater than the impurity concentration of the $n^-$-type semiconductor region 22, the breakdown voltages of the p-n diodes formed at the junction portions between the p-type semiconductor region 26 and the n-type semiconductor regions 23 are less than the breakdown voltage of the p-n diode formed at the junction portion between the $n^-$-type semiconductor region 22 and the p-type semiconductor region 26. Therefore, when a high reverse voltage is applied, breakdown occurs and a current flows first in the p-n diodes formed at the junction portions between the p-type semiconductor region 26 and the n-type semiconductor regions 23. Breakdown in the terminal part can be avoided thereby, and damage of the semiconductor device 1 due to breakdown of the terminal part can be avoided.

In the semiconductor device 1, the n-type semiconductor regions 23 are provided only in the regions directly under the metal layers 31 and are not provided in the regions directly under the metal layers 32. Therefore, the electric field concentrates in the p-n diodes formed in the regions directly under the metal layers 31, and breakdown easily occurs first in these p-n diodes. Breakdown of the terminal part can be more reliably avoided thereby. Accordingly, the voltage surge withstand capacity of the semiconductor device 1 is high.

Thus, according to the embodiment, both the current surge withstand capacity when a forward surge voltage is applied and the voltage surge withstand capacity when a reverse surge voltage is applied can be improved, As a result, the semiconductor device 1 that has a high surge withstand capacity can be realized.

Second embodiment

A second embodiment will now be described.

Figure 3:
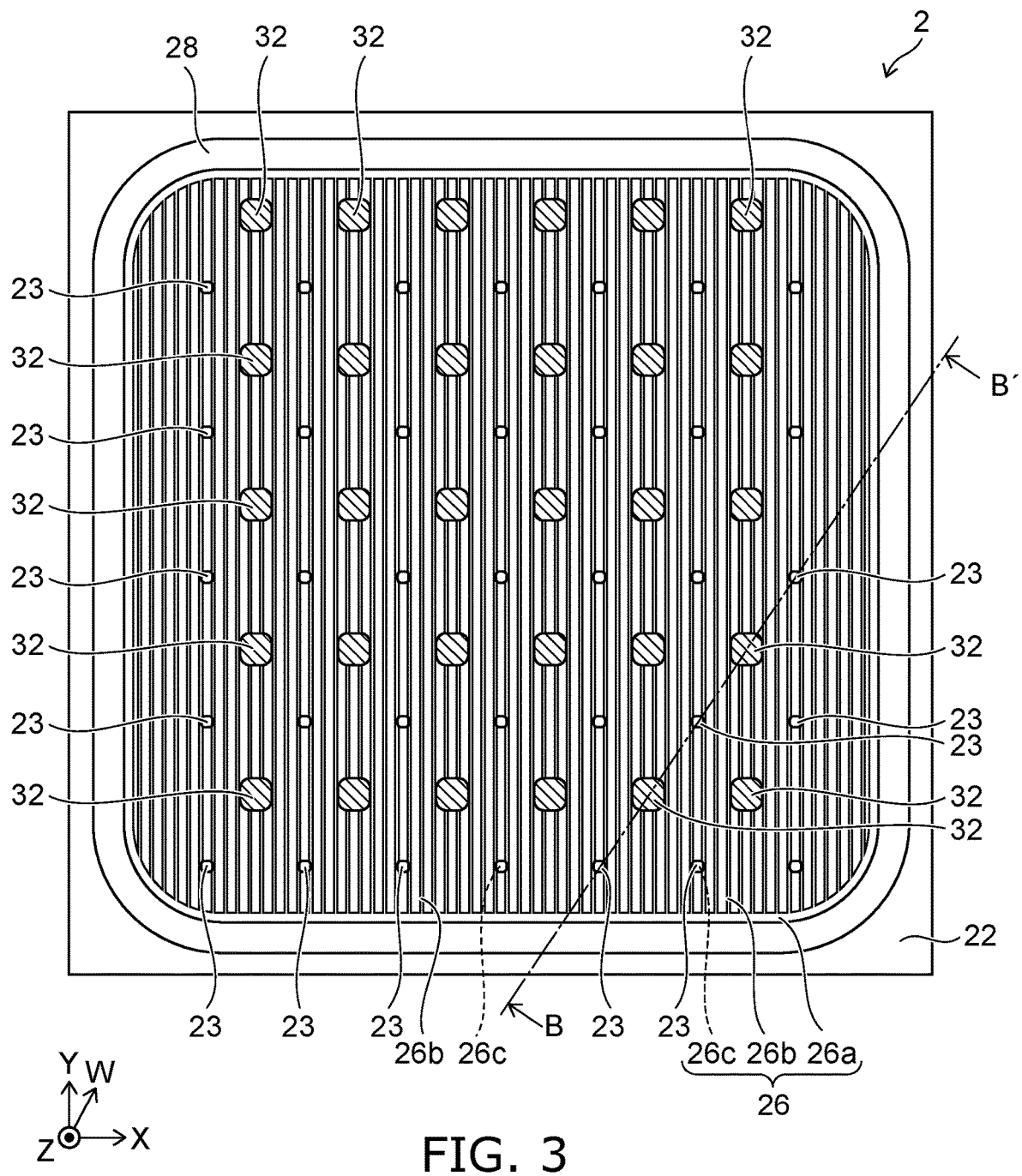
FIG. 3 is a plan view showing a semiconductor device according to a second embodiment.

FIG. 3 is a plan view showing a semiconductor device according to the embodiment.

Figure 4:
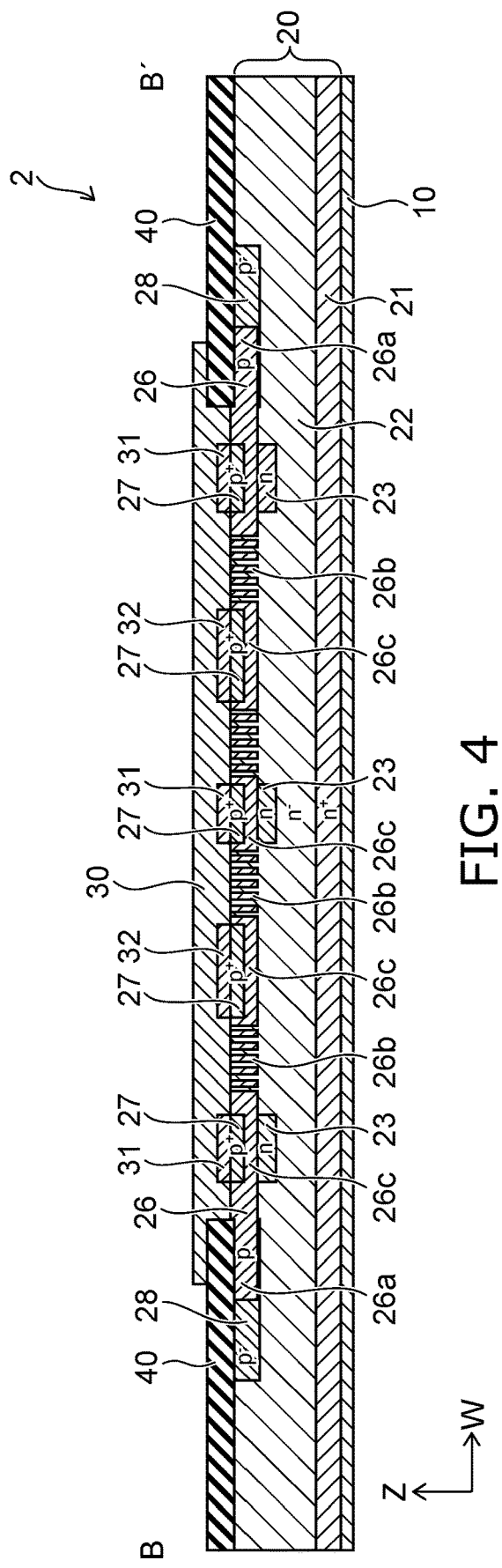
FIG. 4 is a cross-sectional view along line B-B' shown in FIG. 3.

FIG. 4 is a cross-sectional view along line B-B' shown in FIG. 3.

As shown in FIGS. 3 and 4, the semiconductor device 2 according to the embodiment differs from the semiconductor device 1 according to the first embodiment (referring to FIGS. 1 and 2) in that the metal layers 31 are small and the metal layers 32 are large. In other words, in the semiconductor device 2, the surface area of the metal layer 31 is less than the surface area of the metal layer 32 when viewed from the Z-direction. In an example, the diameters of the metal layers 31 and 32 when viewed from the Z-direction each are 13 μm in the first embodiment, On the other hand, in the embodiment, the diameter of the metal layer 31 is 7 μm, and the diameter of the metal layer 32 is 19 μm.

The $p^+$-type semiconductor regions 27, the circular parts 26c of the p-type semiconductor region 26, and the n-type semiconductor regions 23 are provided in the regions directly under the metal layers 31; and the shapes and sizes of the $p^+$-type semiconductor region 27, the circular part 26c, and the n-type semiconductor region 23 are substantially equal to the shape and size of the metal layer 31 when viewed from the Z-direction. Therefore, compared to the semiconductor device 1, the $p^+$-type semiconductor regions 27, the circular parts 26c, and the n-type semiconductor regions 23 also are small in the semiconductor device 2 according to the embodiment.

According to the embodiment, the p-n diodes that are formed of the p-type semiconductor region 26 and the n-type semiconductor regions 23 conduct more easily when the forward voltage is applied because the n-type semiconductor regions 23 are smaller. It is estimated that this is because the electric field concentrates more because the p-n diodes are smaller. As a result, the current surge withstand capacity is increased. Also, because the n-type semiconductor regions 23 are smaller, breakdown occurs more easily in the p-n diodes formed of the p-type semiconductor region 26 and the n-type semiconductor regions 23 when the reverse voltage is applied. Thereby, breakdown smoothly progresses in the cell part, and breakdown of the terminal part can be more reliably avoided. As a result, the voltage surge withstand capacity is increased. Otherwise, the configuration, the operations, and the effects of the embodiment are similar to those of the first embodiment.

First Comparative Example

A first comparative example will now be described.

Figure 5:
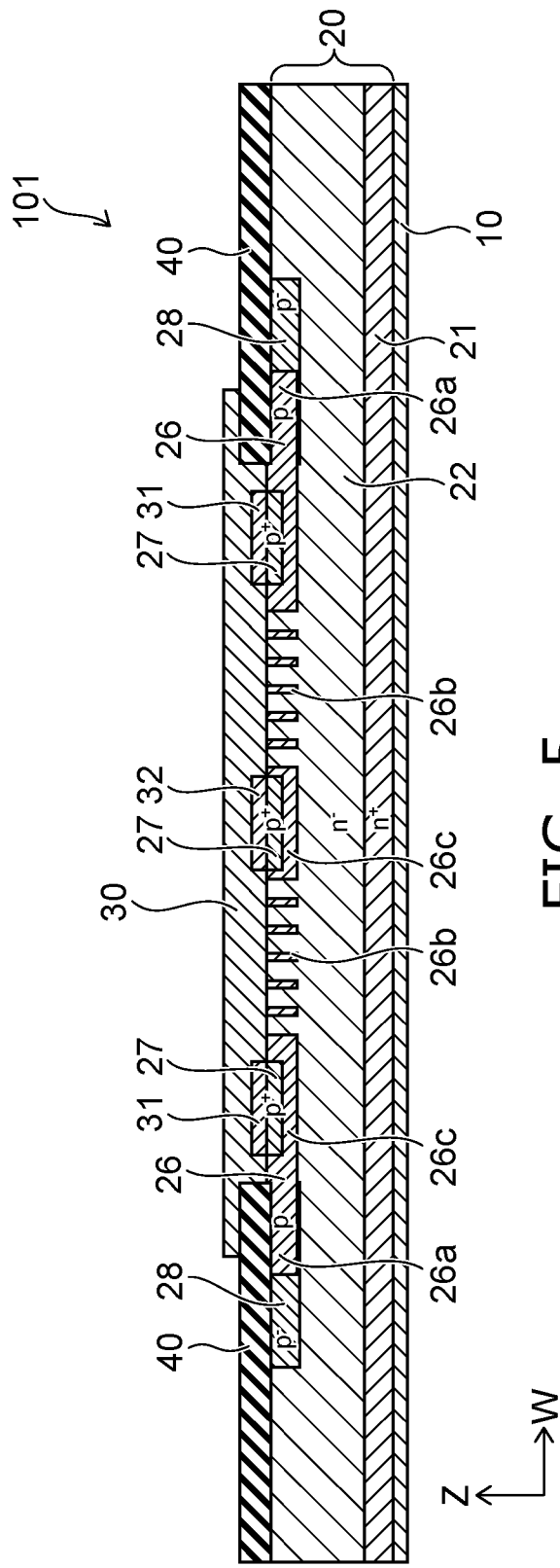
FIG. 5 is a cross-sectional view showing a semiconductor device according to a first comparative example.

FIG. 5 is a cross-sectional view showing a semiconductor device according to the comparative example.

As shown in FIG. 5, the semiconductor device 101 according to the comparative example differs from the semiconductor device 1 according to the first embodiment (referring to FIGS. 1 and 2) in that the n-type semiconductor regions 23 are not provided.

Because the n-type semiconductor regions 23 are not provided in the semiconductor device 101, the p-n diodes are formed only at the junction portion between the $n^-$-type semiconductor region 22 and the p-type semiconductor region 26. Therefore, breakdown of the p-n diodes does not easily occur when a reverse voltage is applied, As a result, breakdown does not occur smoothly in the cell part when the reverse surge voltage is applied, and there is a possibility that breakdown of the terminal part may occur. When breakdown of the terminal part occurs, there is a possibility that the semiconductor device 101 may be damaged.

Second Comparative Example

A second comparative example will now be described.

Figure 6:
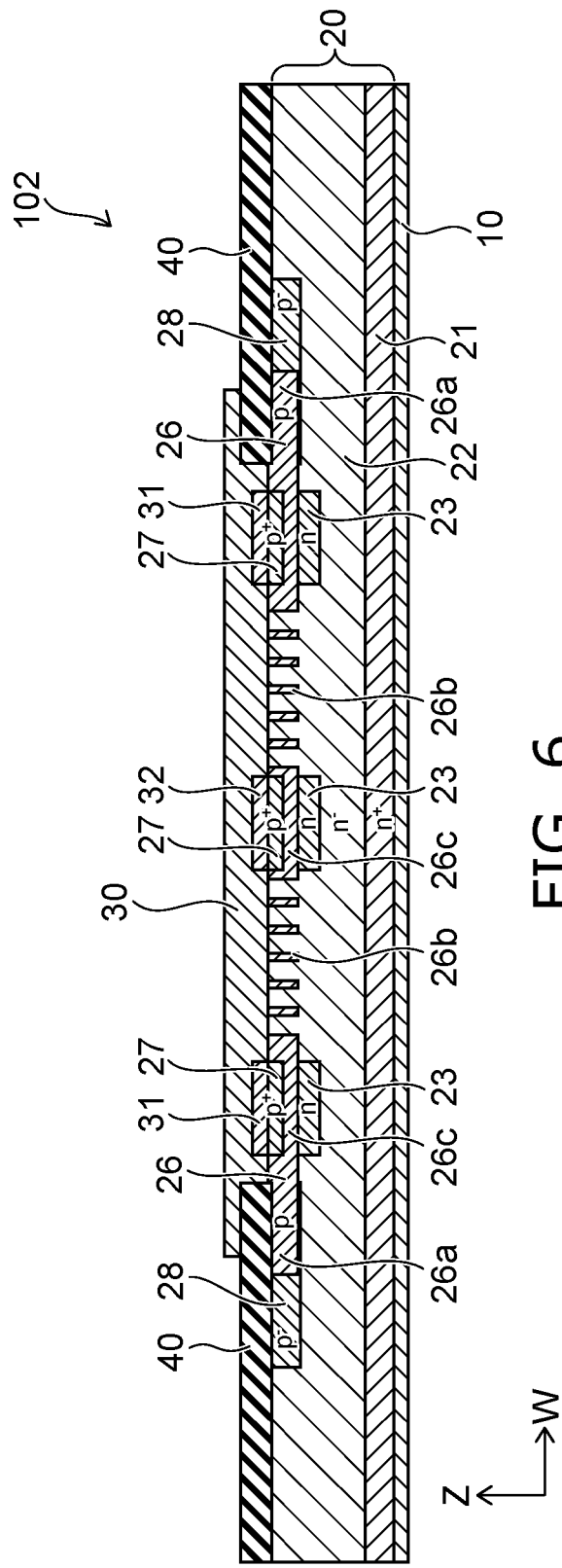
FIG. 6 is a cross-sectional view showing a semiconductor device according to a second comparative example.

FIG. 6 is a cross-sectional view showing a semiconductor device according to the comparative example.

As shown in FIG. 6, the semiconductor device 102 according to the comparative example differs from the semiconductor device 1 according to the first embodiment (referring to FIGS. 1 and 2) in that the n-type semiconductor regions 23 are provided in the regions directly under the metal layers 31 and the regions directly under the metal layers 32.

Because the n-type semiconductor regions 23 are provided in the regions directly under the metal layers 31 and the regions directly under the metal layers 32 in the semiconductor device 102, the electric field does not easily concentrate when a forward surge voltage is applied, and the p-n diodes do not easily conduct. Therefore, there is a possibility that a surge current may flow through the terminal part; and the terminal part may be damaged.

Test Example

A test example will now be described to show the effects of the embodiments described above.

Figure 7A:
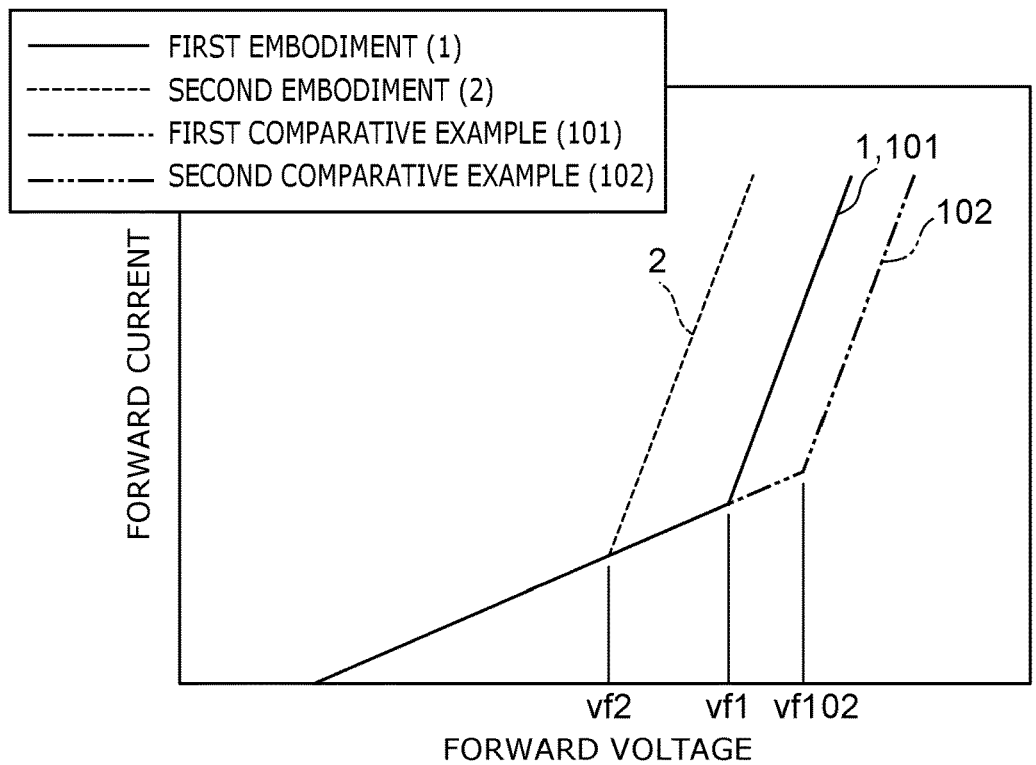
FIG. 7A is a graph showing characteristics of semiconductor devices, in which the horizontal axis is the forward voltage, and the vertical axis is the forward current.
Figure 7B:
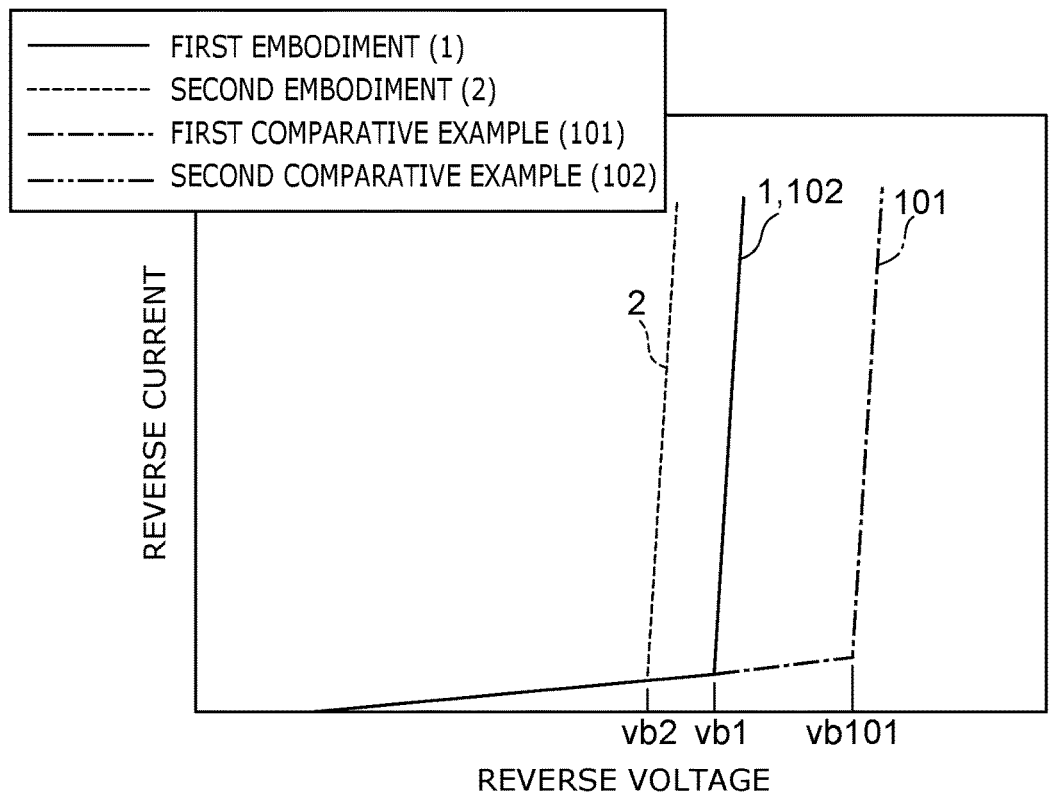
FIG. 7B is a graph showing characteristics of the semiconductor devices, in which the horizontal axis is the reverse voltage, and the vertical axis is the reverse current.

FIG. 7A is a graph showing characteristics of semiconductor devices, in which the horizontal axis is the forward voltage, and the vertical axis is the forward current; and FIG. 7B is a graph showing characteristics of the semiconductor devices, in which the horizontal axis is the reverse voltage, and the vertical axis is the reverse current.

As shown in FIG. 7A, as the forward voltage that is applied to the semiconductor devices described above is increased, first, the Schottky barrier diodes conduct. As the forward voltage is further increased, the p-n diodes conduct, and the conductivity is modulated, A conductivity modulation voltage vf1 at which conductivity modulation occurred in the semiconductor device 1 according to the first embodiment was less than a conductivity modulation voltage vf102 at which conductivity modulation occurred in the semiconductor device 102 according to the second comparative example. Accordingly, it can be said that the current surge withstand capacity of the semiconductor device 1 was greater than that of the semiconductor device 102, Also, a conductivity modulation voltage vf2 at which conductivity modulation occurred in the semiconductor device 2 according to the second embodiment was less than the conductivity modulation voltage vf1. Accordingly, it can be said that the current surge withstand capacity of the semiconductor device 2 was greater than that of the semiconductor device 1.

As shown in FIG. 73, as the reverse voltage that is applied to the semiconductor devices described above is increased, breakdown occurs and a current flows when the reverse voltage reaches a prescribed voltage. A breakdown voltage vb1 of the semiconductor device 1 according to the first embodiment was less than a breakdown voltage vb101 of the semiconductor device 101 according to the first comparative example. Accordingly, it can be said that the current surge withstand capacity of the semiconductor device 1 was greater than that of the semiconductor device 101. Also, a breakdown voltage vb2 of the semiconductor device 2 according to the second embodiment was less than the breakdown voltage vb1 of the semiconductor device 1 according to the first embodiment. Accordingly, it can be said that the voltage surge withstand capacity of the semiconductor device 2 was greater than that of the semiconductor device 1.

Although an example is shown in the first and second embodiments in which the metal layers 31 and 32 are arranged in a hexagonal close-packed configuration, the invention is not limited thereto, The metal layers 31 and 32 may be arranged according to other patterns. The metal layers 31 and 32 may be randomly arranged.

According to the embodiments described above, a semiconductor device that has a high surge withstand capacity can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first electrode;
    a first semiconductor region connected to the first electrode, the first semiconductor region being of a first conductivity type;
    a second semiconductor region provided on the first semiconductor region, the second semiconductor region contacting the first semiconductor region and being of a second conductivity type;
    a plurality of first metal layers and a plurality of second metal layers provided on the second semiconductor region, the plurality of first metal layers and the plurality of second metal layers contacting the second semiconductor region;
    a third semiconductor region provided between the first semiconductor region and the first metal layer, the third semiconductor region contacting the first and second semiconductor regions and being of the first conductivity type, an impurity concentration of the third semiconductor region being greater than an impurity concentration of the first semiconductor region; and
    a second electrode contacting the first semiconductor region, the second semiconductor region, the first metal layers, and the second metal layers, wherein
    a first column includes a plurality of the first metal layers arranged along a first direction, and
    three or more of the first columns are provided.

2. The device according to claim 1, wherein
    a plurality of the third semiconductor regions are provided, at least one of the third semiconductor regions is not provided between the first semiconductor region and the second metal layers.

3. The semiconductor device according to claim 1, wherein
    a surface area of the first metal layer is equal to a surface area of the second metal layer.

4. The device according to claim 1, wherein
    a surface area of the first metal layer is less than a surface area of the second metal layer.

5. The device according to claim 1, wherein
    a second column includes a plurality of the second metal layers arranged along the first direction,
    a plurality of the second columns is provided, and
    the first columns and the second columns are alternately arranged along a second direction orthogonal to the first direction.

6. The device according to claim 5, wherein
    a plurality of the first metal layers is arranged periodically along the second direction, and
    a plurality of the second metal layers is arranged periodically along the second direction.

7. The device according to claim 5, wherein
    the first metal layers and the second metal layers are alternately arranged along a third direction crossing the first and second directions.

8. The device according to claim 5, wherein
    the second semiconductor region includes a plurality of line-shaped parts extending in the second direction.

* * * * *